United States Patent [19]

Ohta et al.

[11] Patent Number: 4,854,265
[45] Date of Patent: Aug. 8, 1989

[54] THIN FILM FORMING APPARATUS

[75] Inventors: Wasaburo Ohta, Yokohama; Tadao Katuragawa, Yamato; Mikio Kinoshita, Kawasaki, all of Japan

[73] Assignee: Ricoh Company, Ltd., Tokyo, Japan

[21] Appl. No.: 167,850

[22] PCT Filed: Jun. 18, 1987

[86] PCT No.: PCT/JP87/00398
§ 371 Date: Feb. 10, 1988
§ 102(e) Date: Feb. 10, 1988

[87] PCT Pub. No.: WO87/07916
PCT Pub. Date: Dec. 30, 1987

[30] Foreign Application Priority Data

Jun. 18, 1986 [JP] Japan ............... 61-142197
Sep. 29, 1986 [JP] Japan ............... 61-232731
Feb. 5, 1987 [JP] Japan ............... 62-25196
Feb. 5, 1987 [JP] Japan ............... 62-25197

[51] Int. Cl.$^4$ ............... C23C 14/48
[52] U.S. Cl. ............... 118/723; 204/192.31; 204/298
[58] Field of Search ............... 118/723; 204/192.31, 204/298, 298 PI

[56] References Cited

U.S. PATENT DOCUMENTS 4,440,108  4/1984  Little ............... 118/723
4,480,010  5/1983  Sasanuma ............... 204/192.31

FOREIGN PATENT DOCUMENTS 59-89763  5/1984  Japan ............... 427/38

Primary Examiner—Richard Bueker
Attorney, Agent, or Firm—Oblon, Spivak, McClelland, Maier & Neustadt

[57] ABSTRACT

A thin film forming apparatus including a vacuum tank capable of introducing an active gas and/or an inert gas thereinto; a source of evaporable substance disposed in the tank; a counter electrode disposed opposite to the source of evaporable substance in the tank and holding a substrate on which a thin film is to be vapor-deposited; a filament disposed between the source of evaporable substance and the counter electrode for generating thermal electrons; a grid disposed between the filament and the source of evaporable substance, and allowing evaporated substance to pass therethrough; and power source means for putting the grid at a positive potential relative to the counter electrode. Electrons emitted from the filament form a plasma in the vicinity of the grid and ionize evaporable substance from the source of evaporable substance before being absorbed by the grid. The ionized evaporated substance then is accelerated toward the substrate for low-temperature deposition on the substrate. Therefore, even a material having low thermal resistance, such as plastics, can be used as the substrate.

8 Claims, 4 Drawing Sheets

THIN FILM FORMING APPARATUS

TECHNICAL FIELD

This invention relates to a thin film forming apparatus suitable for the formation of thin metal films or semiconductor films composing IC, LSI, etc.

BACKGROUND TECHNIQUE

Conventionally, as a means typical of a PVD process for forming a thin film, there is a so-called ion plating process which includes generating a high-frequency electromagnetic field between a source of evaporation and an object to be vapor-deposited (substrate) to ionize substances evaporated in an active gas or an inert gas to perform vacuum vapor deposition. Also, a DC ion plating process which applies a d.c. voltage between a source of evaporation and an object to be vapor-deposited is proposed in Published Examined Patent Applications Nos. 29971/1977 and 29091/1977, etc. According to these methods, the surface of a substrate which is an object to be vapor-deposited is cleaned and activated by ion impact and the adhesion of a film formed is high. However, these methods have the drawback that in order to obtain predetermined ionization, a certain quantity of active or inert gas must be introduced into a vacuum tank and the quality of the resultant thin film is not so good.

In contrast, a CVD process is capable of forming a film by using a relatively simple installation compared to the PVD process and has strong reactiveness. However, the substrate must be raised to a predetermined temperature, so that this method cannot be applied to a substrate, for example, of plastics having no thermal resistance.

A first object of this invention has been made in view of the above and is to provide a new thin-film forming apparatus which is capable of forming a thin film efficiently.

A second object of this invention is to provide a thin film forming apparatus which is applicable to a substrate, for example, of plastics having no thermal resistance.

A third object of this invention is to provide a thin film forming apparatus which is not influenced by an electric field which varies depending on the shape of a source of evaporation or thermal electrons produced from the source of evaporation.

DISCLOSURE OF THE INVENTION

The first object of this invention is achieved by a thin film forming apparatus comprising:

a vacuum tank capable of introducing an active gas and/or an inert gas thereinto;

a source of evaporation disposed within the tank;

a counter electrode disposed opposite to the source of evaporation within the tank and holding a substrate to be vapor-deposited;

a filament disposed between the source of evaporation and the counter electrode for generating thermal electrons;

a grid disposed between the filament and the source of evaporation for allowing evaporated substances to pass therethrough;

power source means for realizing a predetermined electric state within the tank; and electrically conductive means for electrically connecting the tank inside and the power source means, the grid being put at positive potential relative to the counter electrode.

The second object of this invention is achieved by a thin film forming apparatus comprising a vacuum tank for introducing an active gas, an inert gas or a mixed gas of both thereinto; a source of evaporation for evaporating an evaporable substance within the tank; a counter electrode disposed within the tank, holding a substrate so that the substrate is opposite to the source of evaporation, and put at the same potential as, or at a negative potential relative to, the source of evaporation; a grid disposed between the source of evaporation and the counter electrode, and put at a positive potential relative to the counter electrode and the source of evaporation for allowing evaporated substances to pass therethrough; and a filament disposed between the grid and the source of evaporation for generating thermal electrons.

The third object of this invention is achieved by a thin film forming apparatus comprising a vacuum tank for introducing an active gas, an inert gas or a mixed gas of such active and inert gases thereinto; a source of evaporation for evaporating an evaporable substance within the tank; a counter electrode disposed within the tank, holding a substrate on which a thin film is formed so that the substrate is opposite to the source of evaporation; a first grid disposed between the source of evaporation and the counter electrode for allowing evaporated substances to pass therethrough; a filament disposed between the grid and the source of evaporation for generating thermal electrons; a second grid disposed between the filament and the source of evaporation for allowing the evaporated substances to pass therethrough; and power source means for putting the first and second grids, the counter electrode, and the filament in such predetermined electric potential relationship so that the first grid is positive in potential relative to the counter electrode and that the second grid is positive, negative or zero in potential relative to the counter electrode.

BRIEF DESCRIPTION OF THE DRAWINGS

These and other objects, as well as features of this invention will become apparent from the following descriptions for preferred embodiments while referring to the accompanying drawings, wherein.

A first embodiment will now be described with reference to FIG. 1.

A thin film forming apparatus of the first embodiment includes a vacuum tank, a source of evaporation, a counter electrode, a filament, a grid, power supply means, and electrically conductive means.

The vacuum tank is adapted to introduce thereinto an active gas, an inert gas or a mixed gas of both. The source of evaporation, counter electrode, filament, and grid are disposed within the tank.

The counter electrode and the source of evaporation are disposed so as to oppose each other. The counter electrode is adapted to hold a substrate to be vapor deposited on its side opposite to the source of evaporation.

The grid is interposed between the source of evaporation and the counter electrode and is given a positive potential compared to the counter electrode by the power source means. Therefore, during vapor deposition, a generated electric field is directed from the grid to the counter electrode. Of course, the grid is such that evaporated substances can pass therethrough.

The filament disposed between the grid and the counter electrode is for generating thermal electrons.

The power source means is means for supplying an electric power into the vacuum tank and is adapted to be connected to the tank inside via the electrically conductive means.

As just described above, in the film forming apparatus of this embodiment, the filament is disposed on the counter-electrode side of the grid, so that positive ions both of the evaporated substance and introduced gas due to thermal electrons will be produced mainly on the counter electrode side of the grid.

Figure 1:
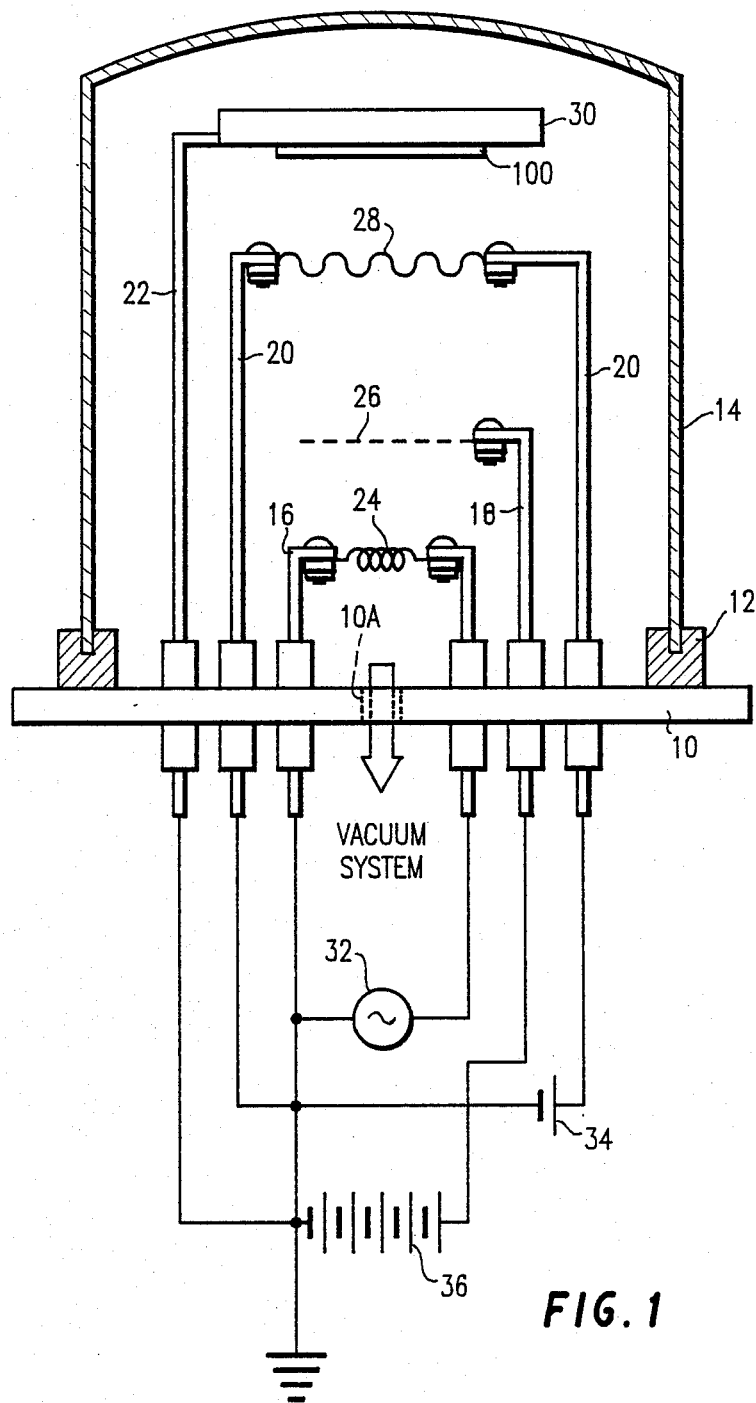
FIG. 1 shows a first embodiment of a thin film forming apparatus according to this invention.

In FIG. 1, reference numerals 10, 12 and 14 denote a base plate, a packing and a bell jar, respectively. Bell jar 14 and base plate 10 are fixed as a unit via packing 12 to constitute the vacuum tank into which an active gas and/or an inert gas are adapted to be introduced in a well-known manner. A bore 10A provided in the center of base plate 10 is coupled to an exhaust system, not shown.

Provided on the base plate 10 are electrodes 16, 18, 20 and 22 which keep the airtightness of the tank and electric insulation from base plate 10 and act also as supports.

These electrodes 16, 18, 20 and 22 electrically connect the inside with the outside of the tank and constitute electrically conductive means together with other wiring appliances.

A source of evaporation 24 of a resistance heating type which includes a coil of a metal such as tungsten or molybdenum is supported between the pair of electrodes 16. The shape of the source of evaporation may be of a boat type instead of the coil. The source of evaporation of the resistance heating type may be replaced with a source of electron beam type used in a conventional vacuum deposition system.

A filament 28, for example, of tungsten, for generating thermal electrons is supported between the pair of electrodes 20. The filament 28 has a net-like shape so as to cover the dispersion of particles evaporated from the source of evaporation.

Electrode 18 supports a grid 26 which has a configuration through which evaporated substance can pass toward filament 28. In this embodiment, grid 26 takes the form of a net.

Electrode 22 supports at its tip a counter electrode 30 which holds a vapor-deposited substrate 100 so that substrate 100 can be opposed to the source of evaporation 24 in an appropriate manner.

Electrode 16 supporting the source of evaporation 24 is connected to an a.c. source 32 for heating purposes.

Electrode 18 is connected to the positive pole of a d.c. voltage source 36, and electrode 22 is connected to the negative pole of source 36. Therefore, grid 26 is at a positive potential compared to counter electrode 30 so that the electric field is directed from grid 20 to counter electrode 30 between grid 26 and electrode 30.

In addition, the pair of electrode 20 is connected to a power source 34.

Therefore, in this embodiment, power sources 32, 34 and 36 constitute the power source means. It is to be noted that grounding shown in FIG. 1, is not necessarily required.

Actually, the above electric connections include various switches (part of the electrically conductive means) which will be operated to perform the film forming process. These switches are not shown.

Thin film formation according to this embodiment will now be described.

As shown, deposited substrate 100 is held by counter electrode 30 and an evaporable substance is held by the source of evaporation 24. The substance is determined by a thin film to be formed. For example, it may be a metal such as aluminum or gold; an oxide, fluoride or sulfide of a metal; or an alloy.

An active gas, an inert gas or a mixed gas of active and inert gases is introduced in advance into the vacuum tank at a pressure of $10^{-2}$–$10^{-5}$ Torr. In this embodiment, assume that the introduced gas is, for example, an inert gas such as argon.

Under such condition, when the apparatus is operated, the source of evaporation 24 heats the evaporable substance held thereby to evaporate. The evaporated substance, namely, its particles fly dispersively toward substrate 100 and pass through grid 26.

On the other hand, filament 28 emits thermal electrons which are accelerated to fly toward grid 26 by the electric field between grid 26 and counter electrode 30. When the accelerated thermal electrons hit the evaporated particles which have passed through grid 26, the particles are ionized into positive ions.

The ionized substances are accelerated by the action of the electric field directed from grid 26 to counter electrode 30 to fly and hit upon deposited substrate 100 at high speed. Thus a desired thin film is formed on substrate 100. This thin film is excellent in adhesion, crystallinity and orientation. This is due to the ionization of the evaporated substance.

In the thin film forming apparatus of this embodiment, the ionization rate of the evaporated substance is high, so that a thin film having a desired physical properties can be easily obtained even when an active gas is introduced alone into the tank or introduced together with an inert gas into the tank to thereby form the thin compound film by combining the evaporated substances with the active gas.

For example, if argon and oxygen are introduced as the inert gas and active gas, respectively, the pressure in the tank is adjusted to a value of from $10^{-3}$–$10^{-4}$ Torr and aluminum is selected as an evaporable substance, a thin film of $Al_2O_3$ will then be formed on the deposited substrate, further, if In or Zn is selected as evaporable substance, thin films of $In_2O_3$ or $ZnO$ will be obtained.

If $H_2S$ and Cd are selected as the active gas and evaporable substance respectively, a thin film of CdS will be obtained. In addition, if ammonia is used as the active gas together with argon, and Ti or Ta is selected as the evaporable substance, thin film of TiN or TaN will be obtained.

Since thermal electrons attribute effectively to the ionization of the evaporable substances and introduced gas, vapor deposition is possible under a high vacuum below $10^{-4}$ Torr, so that the number of gas molecules taken into the thin film can be extremely reduced to thereby provide a thin film of high purity. Thus, the thin film forming apparatus of this embodiment is suitable for the formation of thin semiconductor films constituting part of IC, LSI, etc., and thin high-purity metal films as the electrodes therefor.

A second embodiment will now be described with reference to FIG. 2.

The thin film forming apparatus of the second embodiment mainly includes a vacuum tank, a source of evaporation, a counter electrode, a grid and a filament for generating thermal electrons.

An active gas or an inert gas or a mixed gas of both is introduced to the vacuum tank. A counter electrode in this invention is disposed in the tank and holds a substrate opposite to the source of evaporation. The counter electrode is put at equal or negative potential compared to the source of evaporation.

The grid disposed between the source of evaporation and the counter electrode, allows evaporated substances to pass therethrough and is given a positive potential compared to the counter electrode and filament. Therefore, an electric field directed from the grid to the substrate and an electric field directed from the grid to the source of evaporation are formed in opposite directions within the vacuum tank.

The filament for generating thermal electrons is disposed within the tank on the side of the source of evaporation with reference to the grid. Thermal electrons produced by the filament are used to ionize part of the evaporable substance into positive ions. The evaporated substances, part of which is thus ionized, pass through the grid, their positive ionization is expedited by the ionized gases and the ionized substances are accelerated toward the substrate by the action of the above described electric field.

Electrons are radiated from the filament with kinetic energy corresponding to the filament temperature, so that they are not immediately absorbed by the grid at positive potential but pass through the grid, and drawn back by the Coulomb force due to the grid to thereby pass through the grid again. Like this, the electrons repeat their oscillating motion around the grid and finally are absorbed by the grid, so that they do not arrive at the substrate which is therefore not subjected to shocks by the electrons, not heated by the electrons, and is prevented from a rise in the temperature. Therefore, even a material such as plastics having no thermal resistance may be used as the substrate.

Figure 2:
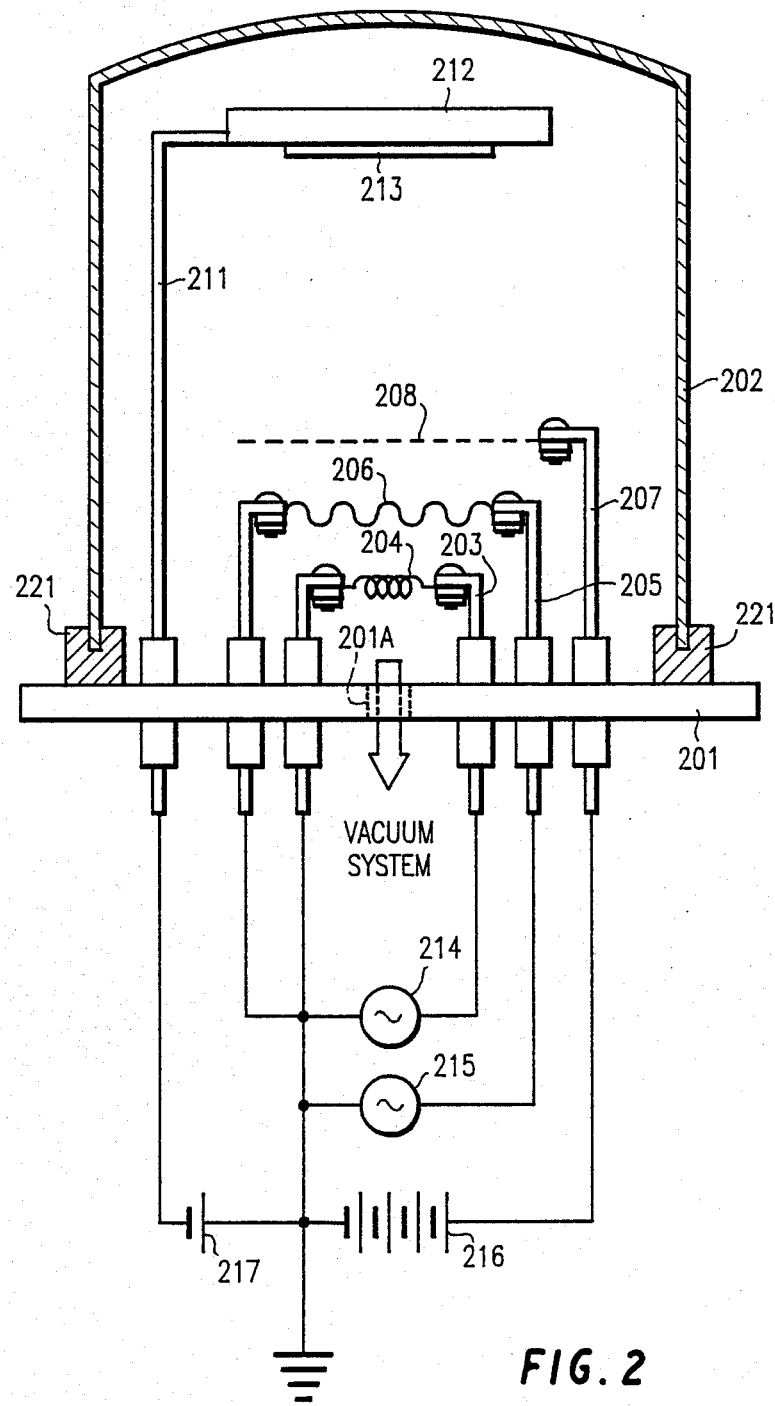
FIG. 2 shows a second embodiment of a thin film forming apparatus according to this invention.

In FIG. 2, base plate 201 and bell jar 202 are fixed as a unit via packing 221 to form the vacuum tank. Electrodes 203, 205, 207 and 211 acting also as supports extend through base plate 201. The bores in the base plate through which the electrodes extend, are of course, sealed in airtight condition. In addition, the electrodes 203, 205, 207 and 211 are electrically isolated from base plate 201. Bore 201A provided in the center of base plate 201 is connected to an exhaust system, not shown.

The pair of counter electrodes 203 supports therebetween a source of evaporation 204 of resistance heating type taking the form of a coil of metal such as tungsten or molybdenum. It is to be noted that instead of such a source of resistance heating type, a source of beam evaporation type known in a conventional vacuum vapor deposition system may be used.

A filament 206, for example, of tungsten, for generating thermal electrons is supported between electrodes 205. The filament 206 has a net-like shape so as to cover the dispersion of particles evaporated from the source of evaporation. Electrode 207 supports grid 208, the shape of which is such that the evaporated substances is allowed to pass therethrough. In this embodiment, the grid is of a net type. Support 211 supports counter electrode 212 which holds substrate 213 on its lower surface in an appropriate manner. If this state is viewed from the side of the source of evaporation 204, counter electrode 212 will be disposed on the back of substrate 213.

Electrodes 203, 205, 207, 211 acting also as supports extend outside the tank and are connected to various power sources as shown. Namely, the electrodes 203 are connected to a power source 214, electrode 207 is connected to the positive terminal of a DC voltage power source 216, and electrode 211 is connected to the negative terminal of a DC voltage source 217. Grounding shown in FIG. 2 is not necessarily needed.

Actually, these electric connections include various switches which can be operated to perform a film forming process. The switches are not shown.

The formation of a thin film using such apparatus will now be described.

Substrate 213 is set as shown and an evaporable substance is held by source of evaporation 204. The evaporable substance is, of course, determined depending on a thin film to be formed. For example, the evaporable substance may be a metal such as aluminum or gold; an oxide, fluoride or sulfide of a metal; or an alloy.

The vacuum tank is maintained in advance at a pressure from $10^{-5}$–$10^{-6}$ Torr. As necessary, an active gas, an inert gas or a mixed gas of both is introduced into the tank at a pressure of from $10^2$–$10^{-4}$ Torr. In this embodiment, assume that introduced gas is an inert gas, for example, of argon.

Under such condition, the power sources are turned on so that a positive potential and a negative potential are applied to grid 208 and counter electrode 212, respectively, and that a current flows through filament 206. Filament 206 is heated to emit thermal electrons. The evaporated substance, namely, its particles, fly divergently toward the substrate. Part of the evaporated substance or the introduced gas spring out electrons from their outer shell by collision with thermal electrons emitted from the filament 206 to become positive ions. Like this, partially ionized evaporated substances pass through grid 208, and they oscillate up and down in the vicinity of the grid, as described above. Ionization is further expedited by collision with the thermal electrons and introduced ionized gas.

That portion of the evaporated substance which has passed through grid 208 and not yet ionized is ionized into positive ions by collision with the introduced ionized gas between the grid and the substrate to thereby increase the ionization rate.

In this way, the evaporated substances ionized into positive ions are accelerated toward substrate 213 by the action of the electric field directed from grid 208 to counter electrode 212 to hit upon and adhere to the substrate with high energy. It forms a thin film excellent in adhesion.

Most of the thermal electrons is finally absorbed into grid 208, and part of the electrons passes through 208 is decelerated by the action of the electric field between substrate 213 and grid 208, so that even if the electrons may arrive at substrate 213, they will not heat substrate 213.

In the particular embodiment, the ionization of the evaporated substances is very high, so that even when an active gas is introduced alone or together with an inert gas into the vacuum tank to form a compound film, a film having desired physical properties can be easily obtained.

For example, if argon and oxygen are introduced as the inert gas and active gas, respectively, the pressure is adjusted to $10^{-4}$ Torr and aluminum is selected as the evaporable substance, a thin film of $Al_2O_3$ will then be formed on the substrate. In this case, if Si or $SiO_2$ is selected as the evaporable substance, a thin film of $SiO_2$ will be obtained. If In or Zn is selected as the evaporable substances, thin films of $In_2O_3$ or ZnO will be obtained. If $H_2S$ and Cd are selected as the active gas and evaporable substance respectively, a thin film of CdS will be obtained. In addition, if ammonia as the active gas is used together with argon, and Ti or Ta is selected as the evaporable substance, thin film of TiN or TaN, will be obtained.

If, for example, an electrode for generating a high-frequency electromagnetic field between grid 208 and counter electrode 212 is provided in the apparatus of this embodiment, the ionization will be further expedited by the electromagnetic field.

Figure 3:
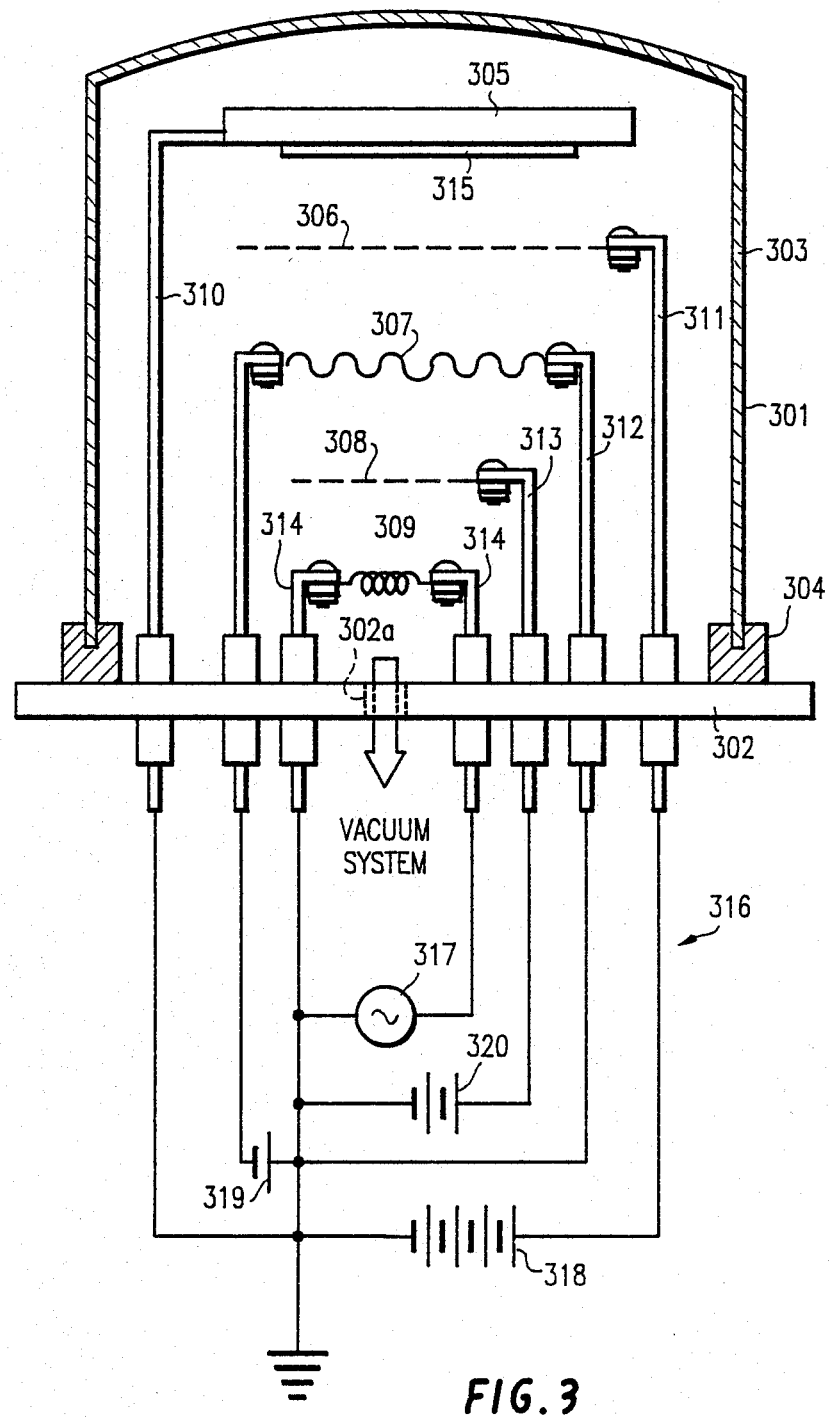
FIG. 3 shows a third embodiment of a thin film forming apparatus according to this invention.

A third embodiment of this invention will now be described with reference to FIG. 3. Bell jar 303 and base plate 302 are fixed as a unit via a packing 304 to constitute vacuum tank 301. Bore 302a formed in the center of base plate 302 is connected to an exhaust system, not shown, and an active gas, an inert gas or a mixed gas of both is introduced into the tank while keeping the airtightness of tank 301 in a well-known manner.

Counter electrode 305, a first grid 306, filament 307, a second grid 308 and source of evaporation 309 are provided within tank 301 at appropriate intervals in order from above. These members are supported horizontally by electrodes 310, 311, 312, 313 and 314, respectively. All of these electrodes are extended outside the tank 301 through base plate 302 and electrically isolated therefrom.

These electrodes 310, 311, 312, 313 and 314 electrically connect the inside with the outside of the tank 301 and constitute electrically conductive means together with other wiring appliances.

The bores in the base plate through which the electrodes extend, are of course, sealed in airtight condition.

A source of evaporation 309 of a resistance heating type which includes a coil of a metal such as tungsten or molybdenum is supported between the pair of electrodes 314. The shape of the source of evaporation may be of a boat type instead of the coil. The source of evaporation of the resistance heating type may be replaced with a source of electron beam type used in a conventional vacuum deposition system.

Substrate 315, on which a thin film is to be formed, is held in an appropriate manner on a lower face of counter electrode 305 opposite to the source of evaporation 309 and held by electrode 310.

Filament 307 held by the pair of electrodes 312 is for generating thermal electrons and made of tungsten or the like. Filament 307 has a net-like shape so as to cover the dispersed particles evaporated from the source of evaporation 309.

First and second grids 306 and 308 supported by electrodes 311 and 313 have configurations, for example, of a net type, through which evaporated substances can pass.

Power source 316 is provided outside vacuum tank 301 and connected via the electrodes 310-314 with counter electrode 305, first and second grids 306, 308, filament 307, source of evaporation 309, etc., disposed within tank 301 so that these elements are put in predetermined electric potential relationship.

The source of evaporation 309 is connected via a heating AC power source 317. A DC power source 318 is provided, the positive pole of which is connected via electrode 311 to first grid 306 and the negative pole of which is connected via electrode 310 to counter electrode 305. Namely, first grid 306 is set so as to be at positive potential compared to counter electrode 305. Thus, the electric field between first grid 306 and counter electrode 305 is directed from first grid 306 to counter electrode 305. Filament 307 is connected via the pair of electrodes 312 to a DC power source 319. Although the positive pole of DC power source 319 is grounded, the negative pole of power source 319 may be grounded instead. Alternatively, an AC power source may be used. Second grid 308 is connected via electrode 313 to the positive pole of DC power source 320. However, second grid 308 may be connected to the negative pole of DC power source 320 or may be grounded directly without using the DC source 320. Namely, second grid 302 may be at positive, negative or zero potential relative to counter electrode 305. These power sources 317-320 constitute power source means 316. The grounding shown is not necessarily needed. Actually, these electric connections include various switches which will be operated to perform a film forming process on substrate 315, but further description on these switches will be omitted.

A thin film forming operation using such thin film forming apparatus will now be described. First, as shown, substrate 315 on which a thin film is to be formed is held on counter electrode 305 and an evaporable substance is held by source of evaporation 309. The evaporable substance used is determined depending on a thin film is to be formed. For example, a metal such as aluminum or gold; an oxide, fluoride or sulfide of a metal; or an alloy may be used as the evaporable substance. An active gas, an inert gas or a mixed gas of both is introduced in advance into tank 301 at a pressure from $10^{-2}$–$10^{-5}$ Torr. Herein, assume that, for example, an inert gas such as argon is introduced.

Under such condition, when the apparatus is operated, the evaporable substance held by source of evaporation 309 is evaporated by heating. Substance evaporated from source of evaporation 309, namely, its particles fly divergently upwardly toward substrate 315 through first grid 306. On the other hand, thermal electrons are emitted from filament 307 heated by DC power source 319. The electrons produced from filament 307 are accelerated by the electric field between first grid 306 and counter electrode 305 to fly toward first grid 306. Thus the electrons hit particles of the introduced gas and evaporated substances present in the space around first grid 306 to ionize them. In this way, a plasma state is realized in the space around first grid 306.

In this case, if second grid 308 is set at positive or zero potential, it will absorb thermal electrons from source of evaporation 309. If second grid 308 is set a negative potential, it will become a barrier to inhibit thermal electrons from passing the source of evaporation 309. Therefore, thermal electrons from source of evaporation 309 hardly affect the plasma produced on the side of substrate 315 beyond second grid 308. Accordingly the plasma can maintain its greatly stabilized condition.

Thus evaporable substance can be ionized in greatly stabilized condition.

The thus ionized evaporated substance is accelerated by the action of the electric field directed from first grid 306 to counter electrode 305 to fly and hit on substrate 315 at a high speed. This causes a desired thin film to be formed on substrate 315. Such a thin film is due to ionization of the evaporated substance, so that it is excellent in adhesion to substrate 305, crystallinity and orientation.

As just described above, according to this embodiment, the ionization of an evaporated substance is very high and stable, so that even when an active gas is introduced alone or together with an inert gas into tank 301 to form a compound film by combining the evaporated substance with the active gas, a film having a desired physical properties can be easily obtained.

For example, if argon and oxygen are introduced as the inert gas and active gas, respectively, the pressure in the tank is adjusted to a value of from $10^{-3}$–$10^{-4}$ Torr and aluminum is selected as an evaporable substance, a thin film of $Al_2O_3$ will then be formed on the deposited substrate, further, if In or Zn is selected as evaporable substance, thin films of $In_2O_3$ or $ZnO$ will be obtained.

If $H_2S$ and Cd are selected as the active gas and evaporable substance respectively, a thin film of CdS will be obtained. In addition, if ammonia is used as the active gas together with argon, and Ti or Ta is selected as the evaporable substance, thin film of TiN or TaN will be obtained.

In this embodiment, since thermal electrons from filament 307 effectively contribute to the ionization of the evaporated substance and introduced gas, ionization of the evaporated substance is possible under a high vacuum below $10^{-4}$ Torr. Therefore, the number of gas molecules taken into the thin film is greatly reduced to provide a thin film of high purity. The thin film can be formed so as to have a very dense structure. As a result, while the density of the thin film is usually said to be lower than the bulk density, the particular embodiment is characterized in that a thin film is obtained which has a density very close to the bulk density. Thus, the thin film forming apparatus according to this embodiment system is very suitable for the formation of thin metal films of high purity as thin semiconductor films and/or their electrodes constituting parts of IC, LSI, etc.

Figure 4:
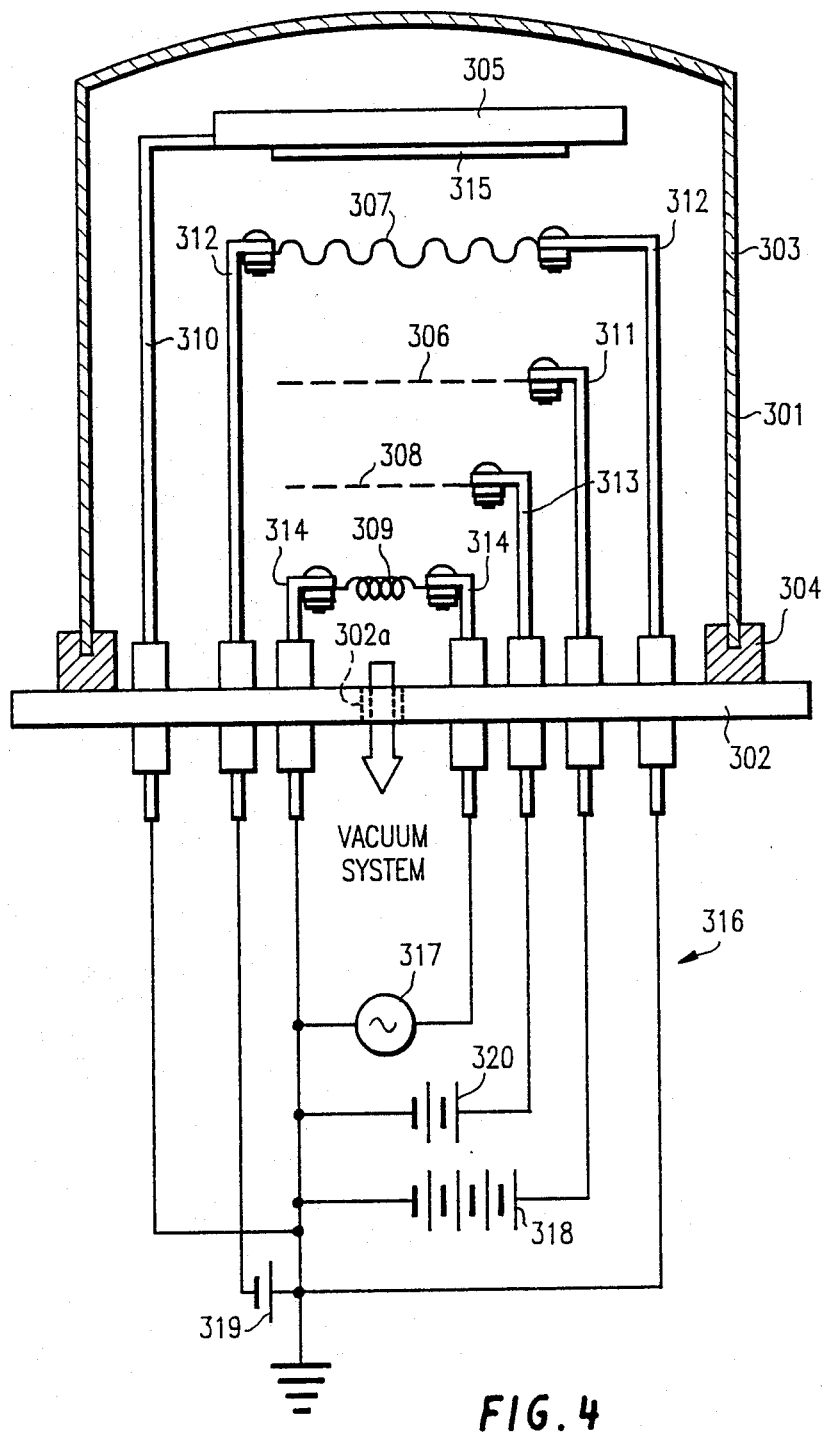
FIG. 4 shows a modification of FIG. 3.

Eventually, this invention could be said to be an unprecedented epock-making thin film forming apparatus which simultaneously realizes the advantage of a CVD process which provides strong reactiveness and the advantage of a PVD process which forms a film in the atmosphere of high vacuum to thereby permit the formation of a dense strong film. Since an evaporated substance is ionized and has high electrical energy (electrons, ion temperature), the formation of a film which requires reactiveness and crystallization is realized without applying thermal energy (reaction temperature and crystallizing temperature), namely, in low temperature. Therefore, substrate 315 may be a plastic plate having a low thermal resistance. FIG. 4 shows a modification of the third embodiment. In FIG. 4, a member identical with that in FIG. 3 is given the identical reference numeral. In this modification, each of first and second grids 306 and 308 is disposed below filament 307. In this respect, the modification differs from the third embodiment, but has substantially similar effects.

Industrial Applicability

As described above, according to this invention, thermal electrons produced by the filament contribute effectively to the ionization of a gas within the vacuum tank, so that ionization of evaporated substances is possible even under a high vacuum below $10^{-4}$ Torr Accordingly, the resulting thin film has a very dense structure. While usually the density of a thin film is said to be lower than that of the bulk, a density very close to the bulk density is obtained according to this invention. The formation of a film under such a high vacuum greatly reduces the number of gas molecules taken into the thin film to thereby provide a thin film of high purity. Namely, a thin film forming apparatus according to this invention is very preferable for the formation of thin metal films of high purity as thin semiconductor films and their electrodes constituting parts of IC, LSI, etc.

Provision of the second grid between the filament and the source of evaporation greatly reduces the influence of electrons produced by the source of evaporation and the electric field which varies depending on the shape of the source of evaporation, on a plasma produced on the side of the counter electrode beyond the second grid to thereby provide a greatly stabilized plasma. Thus a thin film excellent in adhesion, surface smoothness or crystallinity is formed on the substrate. In this case, due to high ionization, a thin film can be formed in a low temperature without application of thermal energy so that the substrate may be a plastic plate or the like having a low thermal resistance.

We claim:
1. A thin film forming apparatus comprising:
    a vacuum tank capable of introducing a gas thereinto;
    a source of evaporable substance for evaporating an evaporable substance in the tank;
    a counter electrode disposed in the tank and holding a substrate on which a thin film is to be formed so that the substrate is opposite to the source of evaporable substance;
    first grid disposed between the source of evaporable substance and the counter electrode, and allowing evaporated substances from said source of evaporable substance to pass therethrough;
    a filament disposed between the first grid and the source of evaporable substance for generating thermal electrons;
    a second grid disposed between the filament and the source of evaporable substance, and allowing the evaporated substance to pass therethrough; and
    power source means for putting the first and second grids, the counter electrode, and the filament in such a predetermined electric potential relationship that the first grid is positive in potential relative to the counter electrode and the second grid is at a predetermined positive, negative or zero potential relative to the counter electrode.

2. A thin film forming apparatus according to claim 1, wherein said vacuum tank contains an active gas.

3. A thin film tank according to claim 1, wherein said vacuum tank contains an inert gas.

4. A thin film tank according to claim 3, wherein said vacuum tank contains an inert gas.

5. A thin film forming apparatus comprising:
    a vacuum tank for introducing an active gas, an inert gas or a mixed gas of an active and an inert gases thereinto;

a source of evaporable substance for evaporating the evaporable substance in the tank;

a counter electrode holding a substrate on which a thin film is formed so that the substrate is opposite to the source of evaporable substance;

a filament disposed between the source of evaporable substance and the counter electrode for generating thermal electrons;

a first grid disposed between the filament and the source of evaporable substance, and allowing evaporated substance from said evaporable substance source to pass therethrough;

a second grid disposed between the first grid and the source of evaporable substance, and allowing the evaporated substance to pass therethrough; and power source means for putting the first and second grids, the counter electrode, and the filament in a predetermined electric potential relationship such that the first grid is at positive potential relative to the counter electrode and the second grid is at a predetermined positive, negative or zero potential relative to the counter electrode.

6. A thin film forming apparatus according to claim 5, wherein said vacuum tank contains an active gas.

7. A thin film tank according to claim 5, wherein said vacuum tank contains an inert gas.

8. A thin film tank according to claim 7, wherein said vacuum tank contains an inert gas.

* * * * *